United States Patent [19]

Butler

[11] 3,982,107

[45] Sept. 21, 1976

[54] REVERSIBLE MEASURING MEANS

[75] Inventor: Michael Butler, Warminster, Pa.

[73] Assignee: American Electronic Laboratories, Inc., Colmar, Pa.

[22] Filed: Sept. 9, 1974

[21] Appl. No.: 504,322

[52] U.S. Cl. ........................ 235/92 DN; 235/92 EV; 235/92 CC; 235/92 PL; 235/92 R; 235/92 V

[51] Int. Cl.[2] ..................... G06M 3/14; H03K 21/02

[58] Field of Search ....... 235/92 DN, 92 EV, 92 PL, 235/92 PB, 92 CC, 92 V; 33/129, 133

[56] References Cited

UNITED STATES PATENTS

| | | | |
|---|---|---|---|
| 3,500,023 | 3/1970 | Arrowood et al. | 235/92 PL |
| 3,549,870 | 12/1970 | Lay | 235/92 PL |
| 3,740,532 | 6/1973 | Esch | 235/92 CC |

*Primary Examiner*—Joseph M. Thesz
*Attorney, Agent, or Firm*—Jacob Trachtman

[57] ABSTRACT

A reversible measuring means for measuring material moving past a station in a forward direction while taking into account movement in a reverse direction comprising a main counter for counting in the forward direction and a reversible counter for counting up from a fixed count and counting down to said fixed count, detector means delivering output signals indicative of the forward and reverse directions of movement and quantity of material moving past a station, and control means receiving signals from said detector means and activating said main counter for counting material moving past said station in the forward direction when the reversible counter has said fixed count and activating said reversible counter for counting up when material moves past said station in the reverse direction and counting down to said fixed count when said material moves in the forward direction.

10 Claims, 2 Drawing Figures

REVERSIBLE MEASURING MEANS

Figure 1:
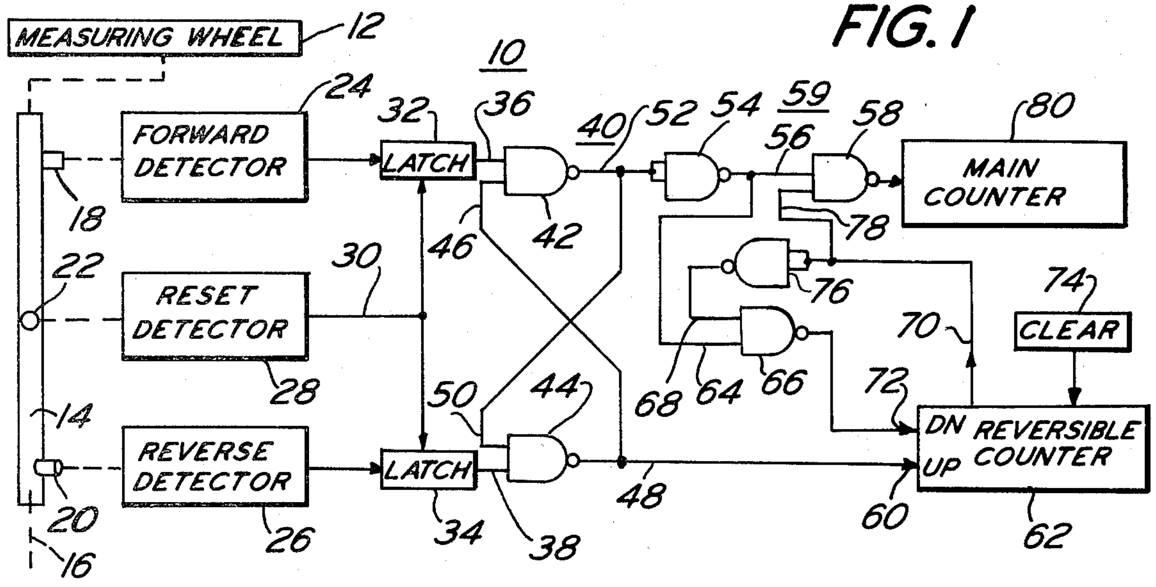

The invention relates to a reversible measuring means, and more particularly to a means for measuring material moving past a station in a forward direction while taking into account movement in a reverse direction.

Heretofore, measuring means have been provided for measuring the length of material moving past a station in the forward direction. This has been accomplished by using a measuring wheel which contacts and rotates with the movement of such material. At times is is desirable and required to move the material in a reverse direction while still maintaining the measurement made and compensating for the reverse movement of material.

It is therefore an object of the invention to provide a new and improved reversible measuring means which measures the movement of material or objects past a fixed station and allows movement of such material and objects in the reverse direction while taking into account such movement when again continuing movement in the forward direction.

Another object of the invention is to provide a new and improved reversible measuring means which automatically compensates for movement in the reverse direction when measurement is being made of material or objects moving in the forward direction.

Another object of the invention is to provide a new and improved simple and accurate method of measuring movement of material in the forward direction while compensating for reverse movement thereof.

Another object of the invention is to provide a new and improved reversible measuring means which can detect the direction of movement of material and provide output signals indicative of the direction of movement and the quantity of material moving past a fixed station.

Another object of the invention is to provide a new and improved reversible measuring means which is highly accurate, reliable and efficient in operation and inexpensive to use and operate.

The above objects as well as many other objects of the invention are achieved by providing a reversible measuring means comprising a main counter for counting in the forward direction and a reversible counter for counting up from a fixed count and counting down to the fixed count. A detector means delivers output signals which are indicative of the forward and reverse directions of movement of the material and the quantity of material moving past a station. Control means are provided for receiving signals from the detector means and activating the main counter for counting material moving past a station in a forward direction when the reversible counter has said fixed count while activating the reversible counter for counting up when material moves past the station in the reverse direction and counting down to the fixed count when material is moving in the forward direction.

The detector means includes a forward detector, a reverse detector and a reset detector sequentially energized by the movement of material past the station. The detector means includes a member which rotates in one direction when the material is moving in the forward direction and in the opposite direction when the material moves in the reverse direction. The member sequentially activates the forward, reverse and reset detectors. The forward detector is energized after the reset detector and before the reverse detector when the material is moving in the forward direction, while the reverse detector is actuated after the reset detector and before the forward detector when the material is moving in the reverse direction. The order or sequence in which the detectors are energized is indicative of the direction of movement of the material and the number of energizations is indicative of the quantity of material moving past the fixed station.

Thus, when material is moving in the forward direction the member rotates in the direction to periodically energize the forward detector before the reverse detector resulting in the output of a series of signals indicating forward motion of material and the quantity of material moving past the fixed station. This count is delivered to the main counter. When the movement of material is reversed, the periodic energization of the reverse detector before the forward detector, results in delivery of a series of signals by the reverse detector indicating reverse movement of material and the quantity of material moving past the station. The delivery of reverse signals results in providing count up signals to the reversible counter. When the material again starts to move in the forward direction, the control means delivers count down signals from the forward detector to the reversible counter until the fixed count is reached at which time the signals from the forward detector are again delivered to the main counter so that the main counter continues counting in the forward direction.

Figure 2:
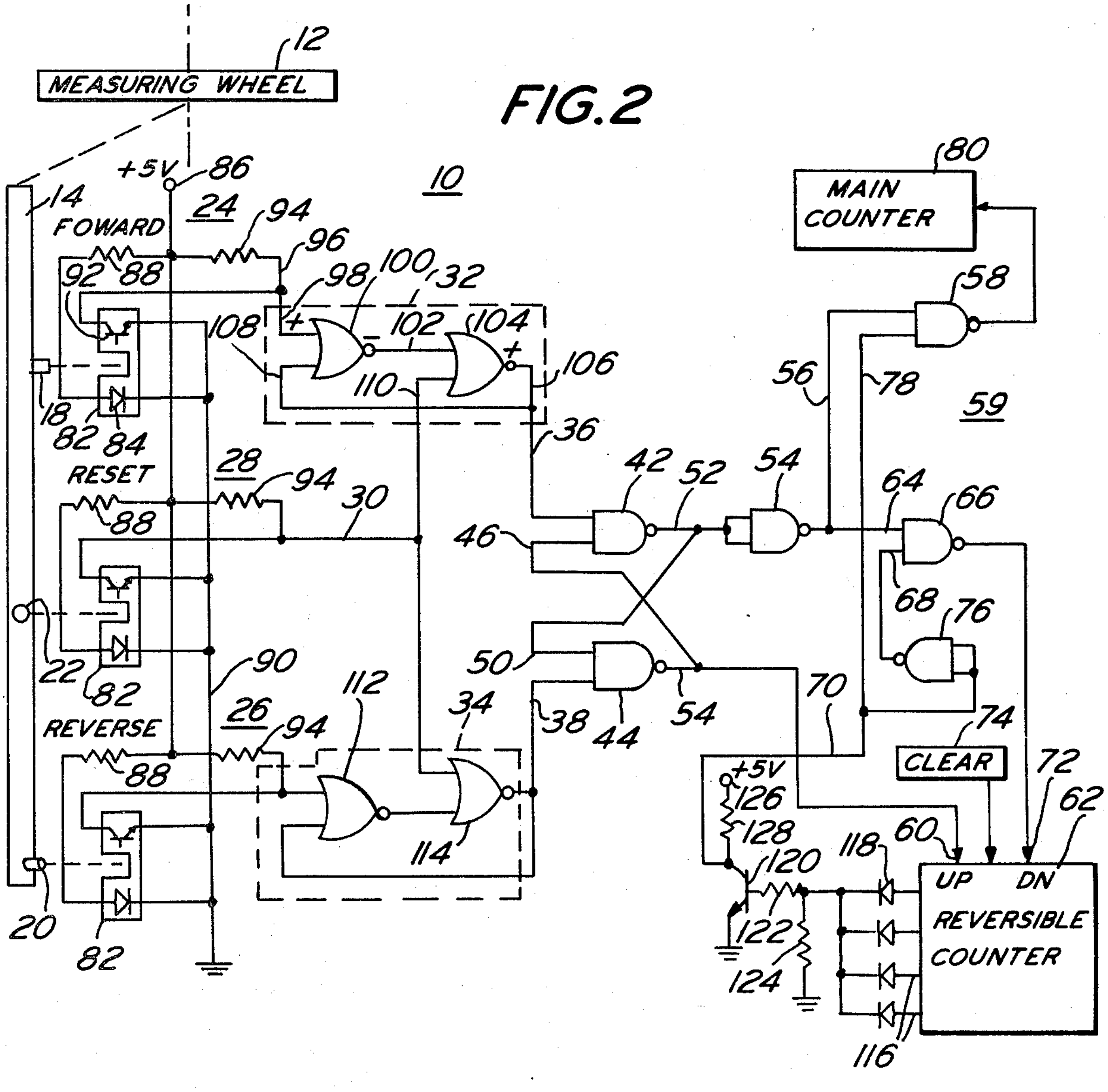

The foregoing and other objects of the invention will become more apparent as the following detailed description of the invention is read in conjunction with the drawing, in which:

FIG. 1 is a block diagram illustrating a reversible measuring means embodying the invention, and FIG. 2 is a diagram in schematic and block form illustrating in greater detail the reversible measuring means of FIG. 1.

Like numerals designate like parts throughout the several views.

The reversible measuring means 10 illustrated in FIG. 1 may be of the type utilized for measuring elongated material passing a fixed station. Such material may be woven or other sheet goods or in the form of cable, rope or other such elongated goods. On the other hand, articles passing a fixed station may also be measured, such as articles moving in spaced relation on a conveyor belt or material of particular densitity carried along a path by conveying means.

The movement of the conveying means or the movement of material past the fixed station may be measured by a measuring wheel 12 contacting the conveyor belt or the moving material, or in other well known ways. The direction of rotation of the measuring wheel 12 corresponds to the direction of movement of material past the station while the number of revolutions or parts of a revolution thereof measures the length or quantity of material moving past the station. In the embodiment 10 illustrated, the movement of the measuring wheel 12 is conveyed to an elongated member or rod 14 which rotates about its longitudinal axis 16 in the clockwise and counter clockwise directions representing respectively forward and reverse movement of material past the fixed station. The elongated member or rod 14 is provided with three pins 18, 20 and 22 which project radially from and perpendicular to the axis 16 of the rod 14. With the rod 14 rotating in the clockwise direction, representing forward movement of material past the station, the pin 18 is positioned at an angle to preceed or lead the pin 20, while the pin 22 is angularly displaced to follow the pin 20. Thus, as illustrated in FIG. 1, pin 20 is displaced 45° from pin 18 while pin 22 is displaced 45° from pin 20 and 90° from pin 18.

A forward detector 24 of the means 10 is positioned to detect the movement past it of the pin 18 of the rod 14, while a reverse detector 26 detects the movement past it of the pin 20 and a reset detector 28 detects the movement past it of the pin 22. Thus with the rod 16 moving in the clockwise direction corresponding to forward movement of material past the fixed station, the forward detector 24 detects the movement of the pin 18 past it, followed by the reverse detector 23 and reset detector 28 sequentially detecting movement of their respective pins 20 and 22 past them. With the arrangement shown, the forward detector 24 would be actuated by the pin 18 after actuation by the reset detector 28 by its pin 22 and before the actuation of the reverse detector 26 by its pin 20 when material is moving in the forward direction. On the other hand, with material moving in the reverse direction the reverse detector 26 is actuated by its pin 20 after actuation of the reset detector 28 by its pin 22, and prior to the actuation of the forward detector 24 by its pin 18.

With material moving past the station in the forward direction the actuation of the reset detector 28 results in its delivery of an output signal over its output line 30 to first and second latch circuits 32 and 34 of a control circuit 40. The circuits 32 and 34 which each have set and reset conditions, are placed in the reset conditions. The following energization of the forward detector 24 results in the delivery of a signal to the latch circuit 32 placing it in its set condition which provides an output signal to line 36. Similarly, the subsequent energization of the reverse detector 26 provides an output signal to the latch circuit 34 placing the latch circuit 34 to its set condition and providing an output signal over the line 38.

The control circuit 40 also includes a pair of gate circuits 42, 44 each having first and second input leads and respectively receiving at the first input leads the output signals from the latch circuits 32 and 34 over the lines 36 and 38. The gate circuit 42 also receives at its second input lead over line 46 the output signal on the line 48 of the second gate circuit 44, while the second gate circuit 44 receives at its second input lead the output signal on the line 52 from the first gate circuit 42 over the line 50.

The gate circuit 42 delivers an output signal on the line 52 upon receiving a signal on line 36 from the latch circuit 32 in the absence of an output signal over the line 46 from the second gate circuit 44. The second gate circuit 44 similarly delivers an output signal on line 48 upon receiving a signal over line 38 from the latch circuit 34 in the absence of a signal over line 50.

The control circuit 40 includes an inverter circuit 54 which receives the output signals on line 52 and delivers them to the input line 56 of a main counter gate circuit 58 of a switching circuit 59. The output signal on line 48 from the second gate circuit 44 is also delivered over line 48 to the count up terminal 60 of a reversible or up-down counter 62.

The switching circuit 59 includes a reversible counter gate circuit 66 which receives the output signal from the inverter 54 over its input line 64. A second input line 68 of the gate circuit 66 receives an input signal from the output of an inverter circuit 76. In the presence of input signals on the lines 64 and 68 of the gate circuit 66, the gate circuit 66 delivers an output signal to the count down terminal 72 of the reversible counter 62.

The reversible counter 62 may comprise an electronic digital counter which is capable of counting in the forward and reverse directions. The output line 70 of the counter 62 provides an output signal when the counter 62 has counter up from a fixed count. Thus, for example, if the fixed count of the counter 62 is 0 the counter 62 will deliver an output signal on the line 70 for any count above 0, and it will deliver no output signal when the counter is cleared to 0 or has a 0 count. Once the counter has counted up from 0 it can only be returned to 0 by counting down to 0 or being cleared by a clear signal 74.

The output signal from the reversible counter 62 is also delivered on the line 70 to the input of the inverter 76 which delivers its output to the second input line 68 of the gate circuit 66 and to the second input line 78 of the gate circuit 58. The presence and absence respectively of input signals on the input lines 56 and 78 to the gate circuit 58 results in the delivery of an output signal by the gate circuit 58 to the main counter causing the counter to increase its count.

In the operation of the reversible measuring means 10, when the measuring wheel 12 rotates with material moving in the forward direction, after the latch circuits have been reset by the signal from the reset detector 28, the forward detector 24 delivers an output signal to the latch circuit 32 prior to the delivery by the reverse detector 26 of its signal to the latch circuit 34. The latch circuit 32 provides a signal to the first gate circuit 42 over line 36. In the absence of an output signal from the second gate circuit 44 to the input line 46 of the gate circuit 42, the gate circuit 42 delivers an output signal on line 52. The output signal on line 52 is delivered to the input line 50 of the gate circuit 44. This results in inhibiting the delivery of an output signal by the second gate circuit 44 upon the subsequent delivery of a signal by the latch circuit 34.

The output signal from the first gate circuit 42 is delivered through the inverter circuit 54 to the gate circuit 58. Assuming that the reversible counter 62 has its fixed count resulting in the absence of an output signal on the line 70, a signal is delivered to the input lead 78 of the gate circuit 58 allowing the delivery of an output signal to the main counter 80 permitting it to count in the forward direction. Where the main counter is provided to measure yardage of material, the rotation of the member 14 can be provided to energize the detectors 24, 26 and 28 at, for example, the rate of 10 times for each yard, measuring a tenth of a yard for each revolution. The count in the main counter 80 can, thus, measure the passage of material in 1/10 yard increments.

The rate at which the main counter 80 increases its count, of course, depends upon the rate of movement of material past the station and the resultant angular speed of measuring wheel 12. When the measuring wheel 12 is stationary, the detectors 24, 26 and 28 fail to provide an output signal so that the count present in the main counter 80 is maintained. If the forward movement of the material is temporarily terminated and the material is moved in the reverse direction, which may be desirable and necessary at various times and under different circumstances, the measuring wheel 12 rotates in the opposite direction. In the example provided, the reverse direction results in the counter clockwise movement of the rod 14. Such movement results in activating the reverse detector 26 after the reset detector 28 and before the forward detector 24. The delivery of an output signal by the detector 26 sets the latch 34 prior to the time that the latch 32 is set by the forward detector 24. This results in delivery of an output signal by the gate circuit 44 which delivers a count up signal to the terminal 60 of the counter 62. At the same time, the output from the gate circuit 44 inhibits the delivery by the gate circuit 42 of an output signal to its line 52. In the following cycle the reset detector 28 again resets the latch circuits 32 and 34 and with the continuing reverse movement, the reverse detector continues to set the latch circuit 34 ahead of the latch circuit 32. This results in delivery of a series of output signals by the second gate circuit 44 over line 48 to the count up terminal 60 of the reversible counter 62 increasing its count. The reversible counter 62, thus, counts the material passing by the fixed station in the reverse direction and provides an output signal on the line 70.

When the material is again moved in the forward direction, the measuring wheel 12 is activated to result in rotation of the rod 14 in the clockwise direction. This activates the forward detector 24 after actuation of the reset detector 28 and ahead of the reverse detector 26. This causes the latch circuit 32 to deliver an output signal to the gate circuit 42 which in turn inhibits the gate circuit 44 and delivers an input signal to the gate circuit 58 through the inverter circuit 54. However, since the reversible counter 62 has counted up from 0, the output signal on line 70 results in delivery of an inhibiting signal to the line 78 of the gate circuit 58 preventing delivery of signals by gate circuit 58 to the main counter 80. The output signal on line 70 from the reversible counter 62, however, also delivers a signal to the gate circuit 66 through the inverter 76 conditioning it for the delivery of output signals upon receipt of signals from the gate circuit 42 through the inverter circuit 54. The signals delivered by the gate circuit 66 to the count down terminal 72 of the reversible counter 62 reduce the count of the counter 62. When the material has moved past the fixed station in the forward direction to the point where the reverse movement was initiated, the count down signals delivered to the count down terminal 72 of the reversible counter 62 will cause it to reach 0 count. This terminates the delivery of an output signal on the line 70. The continued forward movement of the material, thereafter provides signals over line 56 to the gate circuit 58 which is no longer inhibited and delivers the signals to the main counter 80. On the other hand, the gate circuit 66 in the absence of an output signal on line 70 from the reversible counter 62 is inhibited and does not deliver the output signals from the first gate circuit 42 to the reversible counter 62.

The reversible measuring means 10, thus operates to count material as it moves in the forward direction past a fixed station, and when reverse movement of the material occurs terminates counting in the forward direction and counts up on the reversible counter 62. When the material again moves in the forward direction the reversible counter counts down to 0 to indicate the position where the forward count of the main counter ceased, then allows the main counter 80 to continue its count in the forward direction. This manner of operation compensates for any movement of material in the reverse direction and allows the main counter 80 to accurately count material moving in the forward direction while accounting for reverse movement for material.

Refer to FIG. 2 for a more detailed description of the reversible measuring means 10. The forward, reverse and reset detectors 24, 26 and 28 may each be provided with an optical coupler 82, such as the General Electric Company Model H13B, for detecting the pins 18, 20, 22 of the rod 14. However, other means including magnetic and electrical detectors may also be used. Each optical coupler 82 includes a light emitting diode 84 which is energized by deriving a positive potential from terminal 86 through a limiting resistor 88, while being returned to ground potential by line 90. Light emitted by the diode 84 is normally received by the phototransistor 92 which has its collector connected to the positive potential terminal 86 through a load resistor 94 while its emitter is returned to ground potential by the line 90. The transmission of light from the diodes 84 to their phototransistors 92 is interrupted by the pins 18, 20 and 22 of the member 14 when they respectively move proximate to their respective couplers 82. When the light from the diode 82 is received by the phototransistor 92, the phototransistor 92 is conductive returning the load resistor 94 to ground potential through the line 90. However, when the light from the diode 84 is interrupted, the phototransistor becomes nonconductive so that the ends 96 of the resistors 94 joined with the collector of the phototransistors 92 assume a more positive potential approaching the voltage on the terminal 86.

The positive going signal on the end 96 of the resistor 94 of the forward detector 24 is delivered to an input line 98 of the latch circuit 32. The latch circuit 32 may comprise a pair of NOR gates 100 and 104 providing a set and a reset condition.

The first NOR gate 100 of the latch circuit 32 receives input signals over the input lines 98 and 108 and delivers an output signal over the line 102 to the input of the second NOR gate 104. The output line 106 of the second NOR gate 104 provides an input signal to the second input lead 108 of the first NOR gate 100. A second input signal is delivered to the second input lead 110 of the second NOR gate 104 over the line 30 of the reset detector 28. The line 30 is returned through the load resistor 94 of the reset detector 28 to the positive potential terminal 86. When the reset detector has the light of its optical coupler 82 interrupted by the pin 22 of the rod 14, the line 30 goes positive delivering a reset signal to the latch circuit 32.

The latch circuit 34 may be similar to the latch circuit 32 including a first NOR gate 112 receiving an input set signal from the reverse detector 26 and a second NOR gate 114 receiving a reset signal on line 30 from the reset detector 28. The reverse detector 26 and reset detector 28 deliver the set and reset signals upon interruption of the light beams in their optical coupler 82.

In the operation of the latch circuit 32, each of the gates 100 and 104 delivers a negative output signal in the presence of a positive signal on at least one of its input lines and a positive output signal in the absence of a positive input signal at either of its input lines. When the circuit 32 is in its reset condition it provides a negative output signal on line 106, while a positive signal is delivered when it is in its set condition. The circuit 32 is maintained in its set and reset conditions by the feed back of the output signal on line 106 to the input line 108 of the gate 100, until it is triggered to its other condition by the delivery of a set signal over line 98 and a reset signal over line 30.

Thus, when the circuit 32 is in its reset condition the delivery of a positive set signal to the line 98 of the gate 100 provides a negative output signal to the gate 104 which now delivers a positive signal to line 106. The positive signal is also delivered to the input line 108 of gate 100. This maintains a negative output signal from gate 100 even after the positive signal to the input line 98 of gate 100 is removed, keeping the circuit 32 in its set condition. The circuit 32 is reset by the delivery of a positive signal from line 30 to the input line 110 of gate 104, resulting in a negative output signal. In the absence of a positive input signal over line 108 to gate 100, it delivers a positive output signal to the line 102 of gate 104 maintaining the negative signal on the output line 106 even after removal of the reset signal on line 30, keeping the circuit 32 in its reset condition. Thus the delivery of the positive output signal by the detector 24 places the latch circuit 32 in its set condition, while the delivery of the positive output signal by the reset detector triggers the latch circuit 32 to its reset condition.

When the latch circuits 32 and 34 are reset, negative output signals are delivered over their output lines 36 and 38 to the input of the first and second gates 42 and 44. The first and second gates 42 and 44 may be NAND gates which require a positive input signal on each of their two input lines in order to provide a negative output signal. In the absence of positive signals at both input lines of the NAND gates 42 and 44, a positive output signal is provided on the output lines 52 and 54. In the absence of positive output signals from the latch circuits 32 and 34, the NAND gates 42 and 44 each respectively deliver a positive output signal. The output signal from the gate 42 is also delivered to the input line 50 of the gate 44, while the positive output signal from the gate 44 is delivered to the input line 46 of the gate 44. In this manner the circuits 32 and 34 are conditioned for delivering an output signal upon the delivery of an input signal over their respective input lines 36 and 38. However, if the latch circuit 32 is placed in its set condition before the latch circuit 34, the delivery of positive signals to the gate 42 results in the delivery of its negative output signal on line 52 to the input line 50 of the second gate 44. This prevents the subsequent delivery of an output signal by gate 44. Conversely, the delivery of a signal by the latch circuit 34 before the circuit 32 results in the delivery of an output signal by the gate 44 inhibiting delivery of a subsequent output signal by the gate 42.

Thus, after the latch circuit 32 has been set, the subsequent setting of the latch circuit 34 fails to deliver an output signal through the gate 44 due to it being inhibited by the prior delivery of an output signal by the gate 42. Similarly, a prior setting of the latch circuit 34 and the delivery of an output signal by the gate 44 prevents the delivery of an output signal by the gate 42 upon the following setting of the latch circuit 32.

The negative output signal on line 52 delivered by gate 42, is inverted by the inverter circuit 54 which delivers a positive signal over the line 56 to the input of the NAND gate 58 which also requires the delivery of a positive signal to its second input over the line 78 from the reversible counter 62 to deliver a signal to the main counter 80.

A positive signal is delivered on line 78 only when the reversible counter 62 has its fixed count or 0 count. This output signal may be derived from the reversible counter 62, by for example, obtaining the plurality of output signals which provide the digital representation of the count of the counter 62. Thus, if the counter 62 has 0 count, the plurality of digital output lines 116 will all provide negative signals. These signals, because of their polarity, will not be passed through the respective diodes 118 to the base of an NPN type control transistor 120 which is returned to ground through resistors 122 and 124 and is maintained nonconductive. With the transistor 120 nonconductive, the positive potential at terminal 126 is delivered through resistor 128 over line 70 to the input line 78 of the NAND gate 158. This results in delivery of negative output signals to the main counter 80 for each positive signal on line 56 for increasing its count.

In the case where the reversible counter 62 has counted up from its fixed count, a positive output signal will be provided over at least one of the output lines 116 and diodes 118 to the base of the transistor 120. This renders transistor 120 conductive. Since the line 70 is connected to the collector of the transistor 120 which has its emitter returned to ground potential, the conduction of the transistor 120 reduces the signal level over the line 70 to the input lead 78 of the NAND gate 58 inhibiting delivery of output signals by the gate 58 to the main counter 80.

When the reversible counter 62 has counted up from 0 count by receiving signals over line 54 to its input terminal 60 during the reverse movement of material, the output signal from the reverse counter 62 is also delivered through an inverting circuit 76 to the input line 68 of the NAND gate 66. Under such circumstances, the inverter 76 delivers a positive signal to the NAND gate 66. When the material again moves in the forward direction, signals delivered through the inverter 54 to the line 64 of the NAND gate 66 are provided to the count down terminal 72 of the reversible counter 62.

Although the described embodiment of the reversible measuring means 10 utilizes a rotating rod 14 provided with the pins 18, 20 and 22 for carrying out the detecting operation, this may also be achieved by using a single pin such as 18 while angularly positioning the detectors 24, 26 and 28 about the circular path of the pin 18 so that each is sequentially actuated by the pin. In another form, three transparent disks may be fixed to rotate with the shaft 14 and provided with an opaque mark to effectively interrupt the beam of its optical coupler. Also, a single opaque disk may be utilized with the optical detectors angularly spaced about its periphery for detecting the passage of the opaque mark. In place of an opaque mark, an opaque disk may be utilized with a hole in it for normally blocking transmission of light by the optical couplers while detecting the passage of the hole by the transmission of light. The optical couplers may be adapted to this mode of use by inverting their output signals.

It will, of course, be understood that the description and drawing herein contained, are illustrative merely, that various modification and changes may be made in the structure disclosed without departing from the spirit of the invention.

What is claimed is:

1. A reversible measuring means for measuring material moving past a station in a forward direction while taking into account movement in a reverse direction comprising a main counter for counting in the forward increasing direction only and a reversible counter for counting up from a fixed count and counting down to said fixed count, detector means including a plurality of sequentially energizable detectors delivering output signals indicative of the forward and reverse directions of movement and quantity of material moving past a station, and control means receiving signals from said detector means and activating said main counter for counting material moving past said station in the forward direction by increasing its count when the reversible counter has said fixed count and activating said reversible counter for counting up when material moves past said station in the reverse direction and activating said reversible counter for counting down to said fixed count when said material moves in the forward direction.

2. The measuring means of claim 1 in which the detector means includes a forward detector, a reverse detector and a reset detector sequentially energized by the movement of material past said station, the forward detector being energized after the reset detector and before the reverse detector when the material is moving in the forward direction, while the reverse detector is actuated after the reset detector and before the forward detector when the material is moving in the reverse direction.

3. The measuring means of claim 2 in which said detector means includes a member which rotates in one direction when the material is moving in the forward direction and rotates in the opposite direction when said material moves in the reverse direction.

4. The measuring means of claim 3 in which said member of the detector means includes means sequentially activating said forward, reverse and reset detectors.

5. The measuring means of claim 4 in which said member comprises an elongated rod rotatable about its longitudinal axis in the clockwise and counter clockwise directions respectively for correspondence with the forward and reverse direction of movement of material, said rod having at least one pin extending transverse to the axis of said rod, said forward, reverse and reset detectors being positioned with regard to said rod for sequentially detecting the movement past them of said pin.

6. The measuring means of claim 5 in which said detectors comprise photon coupled modules including a light emitting diode and a phototransistor energized by light from said diode, the light from said diode to said phototransistor being interrupted by the passage therebetween of the pin of said rod.

7. The measuring means of claim 1 in which said control means includes a first circuit providing for conditional delivery to the main and reversible counters of signals indicative of the quantity of material moving past said station, a second circuit conditioning the first circuit for delivering signals to the main counter when the detector means delivers signals indicative of the forward movement of material while conditioning the first circuit for delivering count up signals to the reversible counter when the detector means delivers signals indicative of the reverse movement of material, and switching means controlled by the reversible counter for delivering count down signals from the first circuit to the reversible counter when the detector means delivers signals indicative of the forward movement of material and the reversible counter has counted up from said fixed count while preventing delivery of signals to said main counter until said reversible counter has counted down to said fixed count.

8. The measuring means of claim 7 in which the detector means includes a forward detector, a reverse detector and a reset detector sequentially energized by the movement of material past said station to provide respective output signals, the forward detector being energized after the reset detector and before the reverse detector when the material is moving in the forward direction, while the reverse detector is actuated after the reset detector and before the forward detector when the material is moving in the reverse direction, the first circuit of said control means including first and second latch circuits having set and reset conditions and each delivering an output signal when actuated to its set condition, said first and second latch circuits being actuated to their set conditions respectively by output signals from said forward and reverse detectors while being reset by signals from said reset detector.

9. The measuring means of claim 8 in which the second circuit of said control means includes first and second gate circuits each respectively receiving input signals from the latch circuits and conditionally delivering output signals, the first gate circuit delivering an output signal upon receipt of an output signal by the first latch circuit in the absence of an output signal by the second gate circuit, while the second gate circuit delivers an output circuit upon receipt of an output signal by said second latch circuit in the absence of an output circuit by the first gate circuit.

10. The measuring means of claim 9 in which the second gate circuit of the second circuit provides count up signals to the reversible counter and the reversible counter delivers an output signal except when it has its said fixed count, and the switching means of the control circuit includes first and second gate circuits having signal inputs and outputs and receiving at their inputs the output signals from the first gate circuit of the second circuit and the output signals from the reversible counter, the first gate circuit of the switching means delivering an output signal to the main counter upon receiving an output signal from the first gate circuit of the second circuit in the absence of an output signal from the reversible counter while the second gate circuit delivers a count down output signal to the reversible counter upon the receipt of an output signal from the first gate circuit of the second circuit in the presence of an output signal from the reversible counter.

* * * * *